(12) United States Patent
Höhn et al.

(10) Patent No.: US 6,518,819 B2
(45) Date of Patent: Feb. 11, 2003

(54) PUSH-PULL OUTPUT STAGE FOR DIGITAL SIGNALS WITH REGULATED OUTPUT LEVELS

(75) Inventors: Johann Höhn, Berlin (DE); Karl Schrödinger, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/157,636

(22) Filed: May 29, 2002

(65) Prior Publication Data

US 2002/0158675 A1 Oct. 31, 2002

Related U.S. Application Data

(63) Continuation-in-part of application No. PCT/DE01/03799, filed on Sep. 28, 2001.

(30) Foreign Application Priority Data

Sep. 29, 2000 (DE) ........................................ 100 49 774

(51) Int. Cl.[7] ........................ H03K 17/56; H02M 7/162
(52) U.S. Cl. ........................ 327/424; 327/423; 327/541; 327/587
(58) Field of Search ................................. 327/423, 424, 327/587, 588, 108–112, 427, 434, 435, 436, 538, 540, 541, 543

(56) References Cited

U.S. PATENT DOCUMENTS 5,686,859 A * 11/1997 Majumdar et al. .......... 327/110
5,977,819 A    11/1999 Sanwo et al.
6,025,742 A     2/2000 Chan
6,087,885 A     7/2000 Tobita
6,111,431 A     8/2000 Estrada
6,114,898 A     9/2000 Okayasu
6,121,800 A *   9/2000 Leighton et al. ............ 327/110
6,150,853 A *  11/2000 Chrappan et al. ........... 327/108
6,259,305 B1 *  7/2001 Pakriswamy ................ 327/110
6,337,587 B2 *  1/2002 Kruecke ..................... 327/110
6,369,638 B2 *  4/2002 Okubo ....................... 327/112

FOREIGN PATENT DOCUMENTS

DE         198 20 248 A1      11/1999

* cited by examiner

Primary Examiner—Toan Tran
(74) Attorney, Agent, or Firm—Laurence S. Greenberg; Werner H. Stemer; Ralph E. Locher

(57) ABSTRACT

The circuit has a push-pull end stage which acts as an amplifier stage for digital signals. The push-pull end stage has two n-channel MOS transistors which function as source followers and two p-channel MOS transistors which also function as source followers. The gate terminals of the respective n-channel MOS transistors and p-channel MOS transistors are each controlled by an operational amplifier through drivers. A voltage that determines the setpoint value of the high level of the output of the push-pull end stage is present at the non-inverting input of one operational amplifier and a voltage that determines the low level of the output of the push-pull end stage is present at the inverting input of the other operational amplifier. The operational amplifiers interact with feedback elements in such a way that the high level or the low level of the gate voltages of the n-channel and p-channel transistors are controlled at an essentially constant value independently of the operating state of the push-pull end stage.

9 Claims, 2 Drawing Sheets

PUSH-PULL OUTPUT STAGE FOR DIGITAL SIGNALS WITH REGULATED OUTPUT LEVELS

CROSS-REFERENCE TO RELATED APPLICATION

This application is a continuation of copending International Application No. PCT/DE01/03799, filed Sep. 29, 2000, which designated the United States and which was not published it in English.

BACKGROUND OF THE INVENTION

Field of the Invention

The invention relates to a circuit having a push-pull output stage—acting as amplifier stage for digital signals—having in each case two n-channel MOS transistors operating as source followers and p-channel MOS transistors likewise operating as source followers.

Push-pull output stages of the type mentioned above are known in the prior art. They generally have the disadvantage that the fluctuation range of the levels of amplified digital signals, on account of temperature fluctuations, voltage fluctuations of the supply current source and also individual manufacturing tolerances of the individual electronic components, is so high that the output signals of these circuits cannot be used as input signals for diverse other circuits. The application possibilities of the conventional amplifier circuits are thus limited in practice.

SUMMARY OF THE INVENTION

It is accordingly an object of the invention to provide a push-pull end stage for digital signals with regulated output levels, which overcomes the above-mentioned disadvantages of the heretofore-known devices and methods of this general type and which assures that the levels of the output signals lie within a limited or regulatable and in this respect fixedly predeterminable fluctuation range. In other words, it is an object to provide an amplification circuit for digital signals wherein the tolerance of the levels of the output levels (high for a high level and low for a low level) is kept as small as possible.

With the foregoing and other objects in view there is provided, in accordance with the invention, a circuit with a push-pull output stage acting as an amplifier stage for digital signals, comprising:

two n-channel MOS transistors operating as source followers and each having a gate terminal;

two p-channel MOS transistors operating as source followers and each having a gate terminal;

operational amplifiers driving the gate terminals of the respective n-channel MOS transistors and p-channel MOS transistors via drivers;

a first of the operational amplifiers having a non-inverting input carrying a voltage defining a desired value of a high level of an output of the push-pull output stage, a second of the operational amplifiers having an inverting input carrying a voltage defining a desired value of a low level of the output of the push-pull output stage; and a feedback interacting with the operational amplifiers for regulating respective high levels and low levels of gate voltages of the n-channel MOS transistors and the p-channel MOS transistors to a substantially constant value independently of an operating state of the push-pull output stage.

In other words, the objects of the invention are achieved in that the gate terminals of the n-channel MOS transistors and p-channel MOS transistors are in each case drive n by an operational amplifier via drivers, a voltage which defines the desired value of the high level of the output of the push-pull output stage being present at the noninverting input of one of the operational amplifiers, and a voltage which defines the desired value of the low level of the output of the push-pull output stage being present at the inverting input of the other of the operational amplifiers, and the operational amplifiers interacting with feedback means in such a way that the high levels or low levels of the gate voltages of the n-channel and p-channel transistors are regulated to an essentially constant value independently of the operating state of the push-pull output stage.

The circuit according to the invention has the effect that predeterminable voltages regulated to an essentially constant value are present at the gate terminals of the transistors of the output stage, so that the levels of the output signals also lie within a regulatable and fixedly predeterminable fluctuation range.

In this case, the respective operational amplifiers preferably interact with a network circuit having a high level node, which is connected for feedback to the inverting input of one operational amplifier, and a low level node, which is connected for feedback to the noninverting input of the other differential amplifier. The network circuit is preferably a mirror circuit with respect to the output stage, having an n-channel MOS transistor, a p-channel MOS transistor and a resistor arranged in between, the high level node and the low level node being present at the two terminals of the resistor.

In accordance with an added feature of the invention, the transistors of the mirror circuit have the same size as the n-channel transistors and p-channel transistors of the push-pull output stage and the resistor of the mirror circuit is equal to the load resistance of the push-pull output stage. There is thus complete symmetry with respect to the output stage.

However, it likewise lies within the scope of the invention for the transistors of the mirror circuit to differ by a factor 1/n from the n-channel transistors and p-channel transistors of the push-pull output stage, the resistor of the mirror circuit then differing by the factor n from the load resistance of the push-pull output stage, so that overall there is no change in the properties of the mirror circuit. In this case, n is preferably a natural number. The advantage of this variant is that, given smaller transistors and a correspondingly larger resistor, the current consumption of the mirror circuit is reduced.

In the case of a mirror circuit symmetrical with respect to the output stage, the high level of the output of the push-pull output stage is equal to the voltage present at the noninverting input of one of the operational amplifiers, and the low level of the output of the push-pull output stage is equal to the voltage present at the inverting input of the other of the operational amplifiers. The reference voltages at the operational amplifiers thus form the desired value for the high level and the low level of the output voltage of the push-pull output stage.

Two drivers are connected upstream of the push-pull output stage and switch the transistors of the push-pull output stage on and off. The driver stages serve for providing the correspondingly required levels $V_{GHigh}$ and $V_{GLow}$ for the gate voltages in order that the output stage generates the correct output levels. The output levels Q, Qn depend only on the levels $V_{GHigh}$ and $V_{GLow}$.

Other features which are considered as characteristic for the invention are set forth in the appended claims.

Although the invention is illustrated and described herein as embodied in a push-pull output stage for digital signals with regulated output levels, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
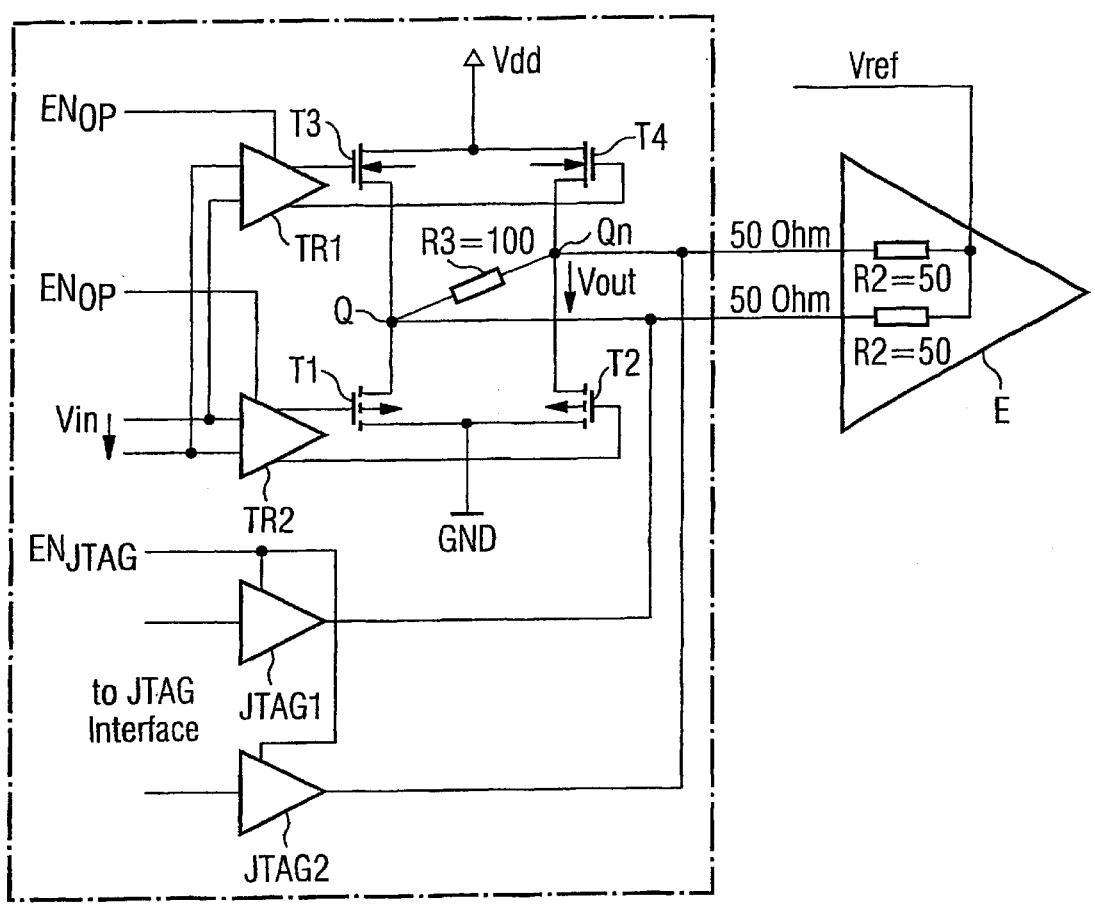
FIG. 1 is a schematic overview diagram of a preferred embodiment of the circuit according to the invention.

Referring now to the figures of the drawing in ditail and first, particularly, to FIG. 1 thereof, there is shown an output stage having two p-channel MOS transistors T1, T2 and two n-channel MOS transistors T3, T4. The transistors T1 and T2, and T3 and T4 are each of the same size and form the push-pull output stage.

They constitute two differential amplifier paths which operate relative to one another (push-pull amplifier). The drain terminals of the n-channel transistors T3, T4 are connected to the operating voltage Vdd and the drain terminals of the p-channel transistors T1, T2 are connected to ground.

Between the fixedly coupled source terminals of the transistors T3, T1 and the fixedly coupled source terminals of the transistors T4, T2, the output voltage Vout is tapped off at the reference points Q, Qn. The outputs Q, Qn are connected to one another via a resistor R3, across which the output signal is dropped.

The resistor R3 is optional and only necessary if the output impedance, including the transistor impedance, is not matched sufficiently well to the line. It is preferably attempted to match the output impedance by means of appropriate design of the transistors, so that the resistor R3 can be obviated. This reduces the current consumption of the output stage by the factor 2.

All four transistors T1 to T4 operate as source followers. The respective diagonally opposite transistors T1, T4 and T2, T3 are in the on state and, by way of their output voltage levels (at the reference points Q, Qn), define the current through the resistor R3 and through load resistors R2, R2' in a downstream circuit section E. In this case, the load resistors R2, R2' preferably have a resistance of 50 ohms, resulting in a total load resistance of 100 ohms (as terminating resistance of a customary differential 50 ohm line).

Drivers TR1, TR2 are provided for switching the transistors T1 to T4 on and off. The drivers TR1, TR2 determine the source potential by way of the respective level at the output of the drivers or at the gate of the transistors T1 to T4. The driver input stages and also an assigned voltage regulator are described in FIG. 2, to which reference is made below.

First, it should be pointed out that provision may optionally be made for switching, by means of an enabler control input $EN_{OP}$, the drivers TR1, TR2 into a state wherein all the transistors T1 to T4 are switched off simultaneously. A so-called (high-impedance) tristate state is achieved in this case. In this state, it is possible, for test purposes, to connect a test circuit known per se (denoted by JTAG) to the output of the amplifier stage. This circuit is activated via the control input $EN_{JTAG}$.

Figure 2:
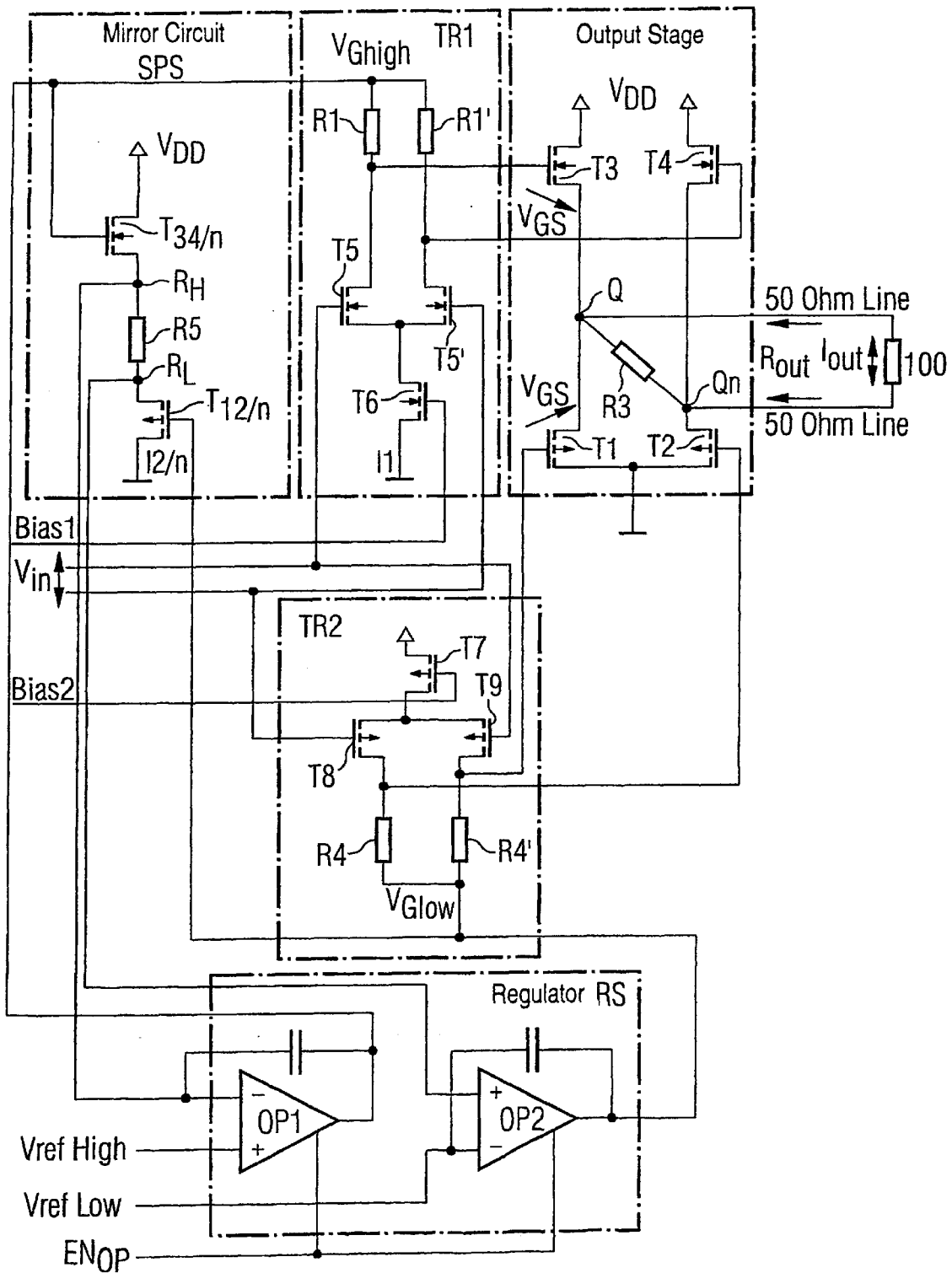
FIG. 2 is a schematic diagram of the embodiment of the circuit according to the invention in more detail than FIG. 1.

In accordance with FIG. 2, two drivers TR1, TR2 are provided for switching the transistors T1 to T4 on and off, the driver TRI driving the transistors T3, T4 and the driver TR2 driving the transistors T1, T2. The drivers TR1, TR2 are each designed as differential amplifiers, as is explained below with reference to the driver TR1.

The driver TR1 has two n-channel MOS transistors T5, T5', whose gate terminals are connected to the input voltage Vin. A further n-channel MOS transistor T6 is connected to the common source terminal of the transistors T5, T5' and serves as current source with the current I1. In this case, a bias voltage Bias1 is present at the gate terminal of the transistor T6 and defines the current flow.

The drain terminal of the transistor T5 is connected via a resistor R1 and the drain terminal of the transistor T5' via a resistor R1', to a voltage $V_{GHigh}$, which is made available by means of a mirror circuit, as will be explained below. In this case, R1 is equal to R1'.

The two transistors T5, T5', with their drain resistors R1, R1', form a differential amplifier. If a differential logic signal is applied via the input voltage Vin to the gate terminals of the transistors T5, T5', then the differential amplifier TR1 supplies an output signal with levels correspondingly matched to the transistors T3, T4.

In a corresponding manner, the driver TR2 is a differential amplifier having p-channel MOS transistors T7, T8, T9 and identical resistors R, R4'. The resistors R4, R4' are connected to a voltage $V_{GLow}$. A bias voltage Bias2 is present at the gate terminal of the transistor T7.

The voltages $V_{GHigh}$ and $V_{GLow}$ are set by means of a mirror circuit SPS connected upstream of the drivers TR1, TR2. The mirror circuit SPS simulates the output stage and supplies a suitable $V_{GHigh}$ and $V_{GLow}$ for the gate voltages in interaction with two operational amplifiers OP1 and OP2. The mirror circuit SPS comprises an n-channel MOS transistor $T_{34}/n$, which is of the same type as the transistors T3 and T4, a p-channel MOS transistor $T_{12}/n$, which is of the same type as the transistors T1 and T2, and a resistor R5 of preferably 100 ohms*n, which corresponds to the load resistor R3 of the output stage.

In this case, n is a scaling factor which serves to reduce the current consumption in the mirror circuit without changing the properties of the mirror circuit. Thus, the transistors $T_{12}/n$ and $T_{34}/n$ of the mirror circuit may be smaller, and the resistor R5 larger, than the corresponding parts of the output stage, without any overall change in the properties.

The drain terminal of the transistor $T_{34}/n$ is connected to a supply voltage potential $V_{DD}$. The source terminal of the transistor $T_{34}/n$ is connected to one terminal of the resistor R5. The other terminal of the resistor R5 is connected to the source terminal of the transistor $T_{12}/n$. The drain terminal of the transistor $T_{12}/n$ is grounded.

A reference voltage $V_{ref\ High}$ for the high level is connected to the noninverting input of the operational amplifier OP1. The inverting input of the operational amplifier OP1 is connected to the source terminal of the transistor $T_{34}/n$. The output of the operational amplifier OP1 is connected to the gate terminal of the transistor $T_{34}/n$ and is present as $V_{GHigh}$ at the two equivalent resistors R1, R1' of the differential amplifier TR1. The source terminal of the transistor $T_{12}/n$ is connected to the noninverting input of the operational amplifier OP2, to whose inverting input the reference voltage for the low level $V_{ref\ Low}$ is applied. The output of this operational amplifier OP2 is connected to the gate terminal of the transistors $T_{12}/n$, which forms the current source I2/n. Furthermore, the output of the operational amplifier OP2 is present as $V_{GLow}$ at the two equivalent resistors R4, R4' of the differential amplifier TR2.

Via an optionally provided enabler line $EN_{OP}$, the operational amplifiers OP1, OP2 can be switched in such a way that the transistors T1 to T4 of the output stage are switched off simultaneously, in order to connect a test circuit to the output of the amplifier stage (cf. FIG. 1). What is achieved with the circuit illustrated in FIGS. 1 and 2 is that a digital, differential output signal is present at the output Q and Qn, which is suitable for a data transmission with a high data rate and is distinguished by a high signal stability or signal integrity. The high signal integrity is achieved in that the output impedance of the output transistors T1 to T4 is matched to the impedance of the transmission line to which the output driver must be connected. This matching is effected by corresponding dimensioning of the output transistors T1 to T4.

The method of operation of the circuit according to the invention is as follows:

In the output stage (transistors T1 to T4), the differential high level (voltage at the output $Q=V_{out\ High}$ and (simultaneously) voltage at the output $Qn=V_{out\ Low}$) is generated if the control voltage $V_{GHigh}$ is present at the gate of the NMOS transistor T3 and (simultaneously) the control voltage $V_{GLow}$ is present at the gate of the PMOS transistor T2.

In this operating situation, the gate voltage of the NMOS transistor T4 of the output stage must be so low that T4 is largely switched off and thus carries virtually no current. Furthermore, in this operating state, the gate voltage of the PMOS transistor T1 must be so high that T1 is switched off.

The operating situation outlined above (differential high level at the output) is assumed for the further explanation of the overall circuit. The output stage can be conceptually simplified in this case. Since the output transistors T1 and T4 are de-energized and, therefore, cannot influence the voltages at the output nodes Q and Qn, respectively, they can be conceptually removed from the circuit. Thus, the output stage now only comprises the transistors T3 and T2, the external load resistor R2, R2' of 100 ohms and the optional terminating resistor R3. The output stage thus corresponds exactly to the mirror circuit.

The task of the mirror circuit is to generate the gate voltages $V_{GHigh}$ and $V_{GLow}$. Two regulating circuits are used for this purpose. The first regulating circuit comprises the operational amplifier OP1 and the transistor $T_{34}/n$ and the second regulating circuit comprises the operational amplifier OP2 and $T_{12}/n$. OP1 generates a voltage at the gate of the transistor $T_{34}/n$ which is established on account of the feedback such that the input differential voltage of OP1 tends toward zero volts. As a result, a voltage which has the same value as the reference voltage $V_{ref\ High}$ at the noninverting input of OP1 is set at the source node of $T_{34}/n$. OP2, on account of its feedback, likewise sets an input differential voltage which tends toward zero volts, whereby the source voltage of the PMOS transistor $T_{12}/n$ assumes the value $V_{ref\ Low}$. The two regulating circuits thus generate the gate voltages $V_{GHigh}$ and $V_{GLow}$, which assume values such that the voltage at the upper node $R_h$ of the resistor R5 is equal to $V_{ref\ High}$ and the voltage at the lower node $R_l$ of the resistor R5 is equal to $V_{ref\ Low}$. The gate voltages $V_{GHigh}$ and $V_{GLow}$. generated by the mirror circuit in conjunction with the two regulating circuits are independent of the operating state of the output stage and independent of the operating states of the driver stages TR1 and TR2.

The task of the driver stage TR1 consists in setting one of the two possible operating states of the output transistors T3 and T4 in a manner dependent on the input voltage Vin. The possible operating states of T3 and T4 in the output stage arise by virtue of the fact that, in the driver stage TR1, the current I1 of the transistor T6, operating as current source, is either conducted completely through T5 (if the gate of T5 is driven with a high level and the gate of T5' is simultaneously driven with a low level) or is conducted completely through T5'.

If the current I1 is conducted through T5', then a voltage drop I1*R1 is produced across the resistor R1', which is connected to the drain of T5'. As a result, the gate voltage of T4 of the output stage assumes the value $V_{GHigh}$-I1*R1. The specification of the quantities I1 and I1' ensures that T4 of the output stage is switched off if the current I2 in the driver stage is conducted through T5'. In this operating state of the driver stage TR1, no current flows through T5 of the driver TR1, and so, moreover, no voltage drop is produced across the resistor R1 connected to the drain of T5. For this reason, the gate voltage of T3 is pulled to the value $V_{GHigh}$ via the resistor R1 on the left in FIG. 2.

The driver stage TR2 sets the gate voltages of the output transistors T1 and T2 according to the same principle as that of the driver stage TR1.

In the case considered above, wherein the gate voltage of T3 has assumed the value $V_{GHigh}$, on account of the input voltage Vin in the driver stage TR2 a state is established wherein the gate voltage at the PMOS output transistor T2 has assumed the value $V_{GLow}$ and the gate voltage of the PMOS output transistor T1 is so high that the latter carries no current. Since the same gate voltages are present at the transistors $T_{34}/n$ and $T_{12}/n$ in the mirror circuit as are present at the transistors of the output stage T3 and T2 and the mirror circuit contains a load element (resistor R5) equivalent to that in the output stage, namely the load resistance of 100 ohms and the optional terminating resistor R3, the voltage $V_{ref\ High}$ is established at the output Q and the voltage $V_{ref\ Low}$ is established at the output Qn. This corresponds to a differential high signal at the output of the circuit.

If the differential input voltage Vin then changes its sign, the transistor T4 of the output stage assumes the state which the transistor T3 previously had and T3 assumes the state which T4 previously had. Corresponding interchanging of the states also takes place at the output transistors T1 and T2. Overall, the output stage thus changes its state from a differential high signal at the output to a state with a differential low signal at the output.

Consequently, a setting of the gate voltage in the high level is effected at the transistors T3 and T4 and a setting of the gate voltage in the low level is effected at the transistors T1 and T2. The operating point is regulated in the mirror circuit SPS, which is operated statically.

It is pointed out that, in an alternative circuit, the transistors T1, T2 and $T_{12}/n$ can be designed as n-channel MOS transistors and the transistors T3, T4 and $T_{34}/n$ can be designed as p-channel MOS transistors. The circuit explained then functions in a corresponding manner. The resistor R3 or the load resistor is driven by the respective drain terminals in this case. The regulation matches the levels in this case, too. The output signal Q is inverted (Q, Qn are interchanged).

The exemplary embodiments of the invention explained above serve merely to impart a better understanding of the teaching according to the invention which is prescribed by the claims and is not restricted as such by the exemplary embodiments.

We claim:

1. A circuit with a push-pull output stage acting as an amplifier stage for digital signals, comprising:

two n-channel MOS transistors operating as source followers and each having a gate terminal;

two p-channel MOS transistors operating as source followers and each having a gate terminal;

operational amplifiers driving said gate terminals of the respective n-channel MOS transistors and p-channel MOS transistors via drivers;

a first of said operational amplifiers having a non-inverting input carrying a voltage defining a desired value of a high level of an output of the push-pull output stage, a second of said operational amplifiers having an inverting input carrying a voltage defining a desired value of a low level of the output of the push-pull output stage; and a feedback interacting with said operational amplifiers for regulating respective high levels and low levels of gate voltages of said n-channel MOS transistors and said p-channel MOS transistors to a substantially constant value independently of an operating state of the push-pull output stage.

2. The circuit according to claim 1, which further comprises a network circuit having a high level node connected for feedback with an inverting input of one of said operational amplifiers and a low level node connected for feedback to a non-inverting input of the other said operational amplifier.

3. The circuit according to claim 2, wherein said network circuit has a mirror circuit with respect to the output stage, having an n-channel MOS transistor, a p-channel MOS transistor, and a resistor connected in between, said resistor having two terminals respectively forming said high level node and said low level node.

4. The circuit according to claim 3, wherein said transistors of said mirror circuit have a size equal to the n-channel MOS transistors and p-channel MOS transistors of the push-pull output stage, and said resistor of said mirror circuit is equal to a load resistance of the push-pull output stage.

5. The circuit according to claim 3, wherein said transistors of said mirror circuit differ by a factor 1/n from said n-channel MOS transistors and said p-channel MOS transistors of the push-pull output stage and said resistor of said mirror circuit differs by a factor n from a load resistance of the push-pull output stage.

6. The circuit according to claim 3, wherein the high level of the output of the push-pull output stage is equal to the voltage present at said noninverting input of said first operational amplifier, and the low level of the output of the push-pull output stage is equal to the voltage present at said inverting input of said second operational amplifier.

7. The circuit according to claim 2, wherein said drivers are connected upstream of the push-pull output stage and the gate voltages made available by said operational amplifiers in interaction with said feedback or voltages dependent thereon are available to said transistors of the push-pull output stage in dependence on an input voltage.

8. The circuit according to claim 1, wherein said drivers are differential amplifiers.

9. The circuit according to claim 1, which comprises a resistor connected between the outputs of the push-pull output stage.

* * * * *